United States Patent [19]

Balter

[11] Patent Number: 4,891,516

[45] Date of Patent: Jan. 2, 1990

[54] DEVICE FOR AXIALLY AND ANGULARLY POSITIONING A BEAM OR THE LIKE IN A SEALED CHAMBER

[75] Inventor: Valentin Balter, Cupertino, Calif.

[73] Assignee: Huntington Mechanical Laboratories, Inc., Mountain View, Calif.

[21] Appl. No.: 316,487

[22] Filed: Feb. 27, 1989

[51] Int. Cl.$^4$ .............................................. H01J 37/20
[52] U.S. Cl. ................................ 250/310; 250/442.3; 250/455.1
[58] Field of Search ............. 250/455.1, 492.3, 396 R, 250/398, 453.1, 454.1, 310, 311, 522.1; 285/226, 227

[56] References Cited

U.S. PATENT DOCUMENTS 4,460,827 7/1984 Onoguchi et al. ................... 250/310

Primary Examiner—Janice A. Howell
Assistant Examiner—Kiet T. Nguyen
Attorney, Agent, or Firm—David Pressman

[57] ABSTRACT

A device for focusing and positioning a high-energy beam in a vacuum chamber comprises a high-energy beam generator (10), which is sealingly connected to a housing (18) of a high-energy beam generator (20), a focusing unit (12) which consists of two tubular elements (26 and 28) having opposite external threads engageable with inner threads on a sleeve (30), and an adjustable connector unit (14) which is connected at one end to the focusing unit and at the other end to a vacuum chamber (16). Connector unit 14 consists of two skewed rings (60 and 62). One of these rings rotates on the lower end of focusing unit (12), while the other end ring is rotatably installed on the end of vacuum chamber (16). Both rings are rotatably connected to each other by means of a set of balls (68) inserted into a race, which is formed by annular grooves on the mating surfaces of the rings. The ball race between the rings is inclined with respect to the guide element which guides ring (60) during its rotation on the focusing unit. As a result, a relative rotation of rings (60 and 62) determines an angular position of the beam (B) emitted by the beam generator with respect to the plane of an object (96) to be treated. The rings can be driven from pulse motors (118 and 120), so that the beam, e.g., an electron beam, can describe any intricate pattern o the obect, e.g., a silicon substrate. Another embodiment of the invention is a device which is based on the same principle, but which can orient a rod (134) which carries a sample (136) to be treated in a vacuum chamber (16).

32 Claims, 5 Drawing Sheets

DEVICE FOR AXIALLY AND ANGULARLY POSITIONING A BEAM OR THE LIKE IN A SEALED CHAMBER

BACKGROUND—FIELD OF THE INVENTION

The present invention relates to vacuum or high-pressure equipment, particularly to devices for positioning an object or a high-energy beam in a sealed chamber, such as a vacuum or high-pressure chamber. Such a device is useful in manufacturing semiconductors, e.g., when implanting electrons in semiconductor substrates.

BACKGROUND—DESCRIPTION OF PRIOR ART

In many closed systems, such as a vacuum system or the like, it is often necessary to position a member at a precise angle and at the same time be able to move the member axially and also change its angle. Such a necessity occurs, e.g., in a device for angularly positioning and focusing an electron beam in a vacuum system in order to scan the surface of a semiconductor wafer with such beam. In other words, the source of the beam is to be moved axially within the chamber for focusing the beam and angularly for scanning the surface of an object. In another situation, it may be required to move a sample holder with a sample along a predetermined path in a closed chamber between two positions where the sample is treated.

A known device which is suitable for this purpose is an adjustable connector unit described in my U.S. Pat. No. 4,629,219, issued Dec. 16, 1986. The connector shown in this patent comprises a pair of side members which are spaced apart and have flanges for connecting the two side members. Each side member has a respective ring rotatably mounted thereon by a first set of balls, and the two rings are rotatably coupled to each other by a second set of balls. Each set of balls is in an annular race formed by a pair of mating grooves. The balls of each set are fed into a respective race through a hole in respective rings, then the hole is plugged to keep the balls in place. The race between the two rings is inclined at an angle relative to the race between each side member and the respective ring, so that rotation of one ring relative to the other will cause a change in the angular orientation of the side members relative to each other without rotating the side members with respect to each other.

There is a need to use my prior device in a sealed system for interconnecting a pair of structural members which can be (a) axially displaced, e.g., for focusing, and (b) angularly displaced, e.g., for scanning the surface of an object with a high-energy beam. To do this, my prior device requires two additional connections in the form of flanges on each side member for connection to mating flanges on a vacuum system.

The provision of two additional connections increases an axial length and weight of the device and requires additional seal rings. This, in turn, makes the device more complicated and expensive to manufacture, and increases risk of leakage.

OBJECTS AND ADVANTAGES OF THE INVENTION

It is accordingly one object of the present invention to provide an improved device for focusing and positioning a high-energy beam or a longitudinal object in a seal chamber. Other objects are to provide such a device which has a reduced weight and a reduced axial dimension, is free of additional connections, reduces the risk of leakage from or into a closed system, and is simple and inexpensive to manufacture. Further objects and advantages will become apparent after consideration of the ensuing description and the accompanying drawings.

REFERENCE NUMERALS USED IN THE DESCRIPTION AND DRAWINGS

Figure 1:
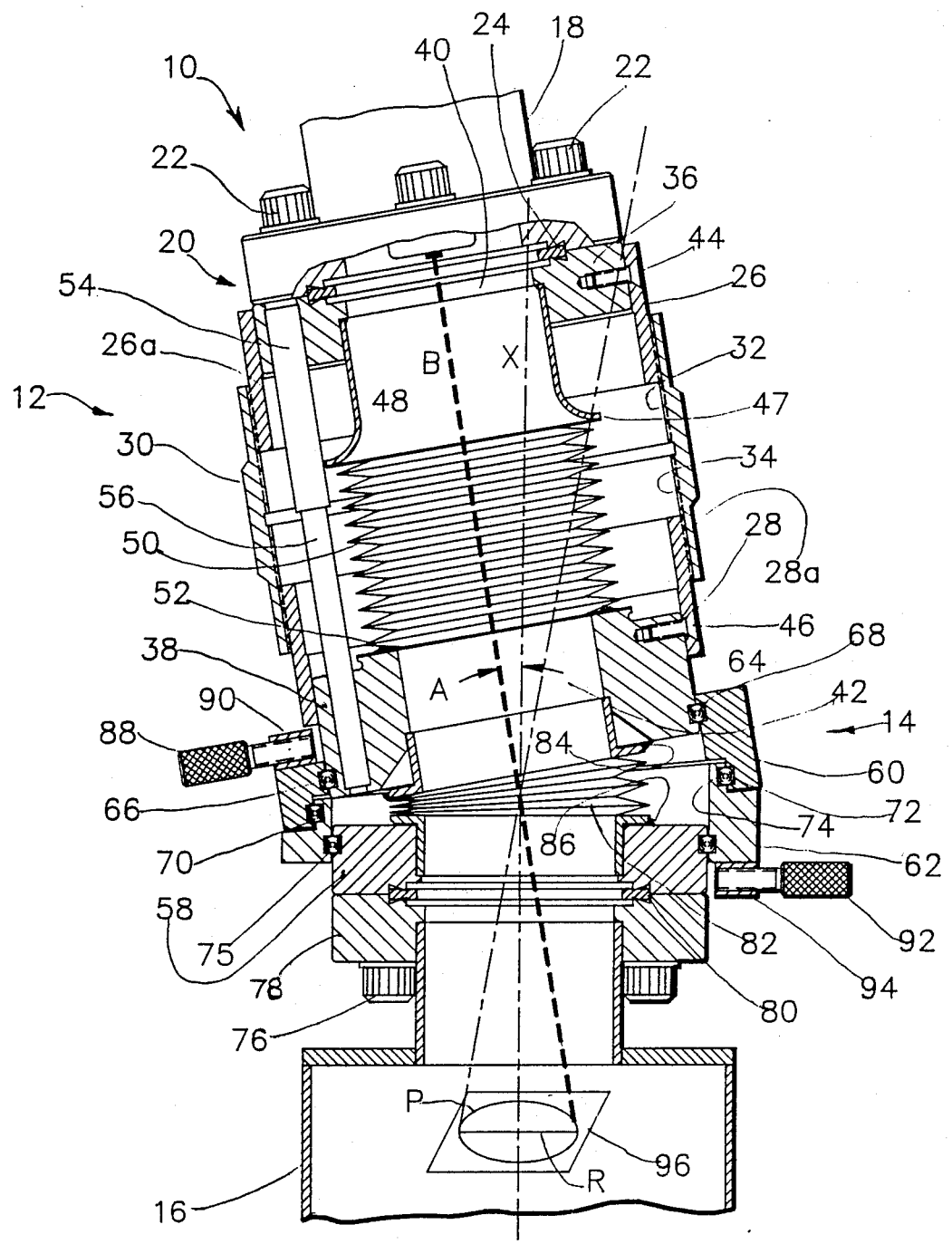
FIG. 1 is a vertical sectional view of a beam focusing and positioning device made in accordance with the invention and shown in a position at which a longitudinal axis of a first side member is inclined with respect to a longitudinal axis of a second side member.
Figure 2:
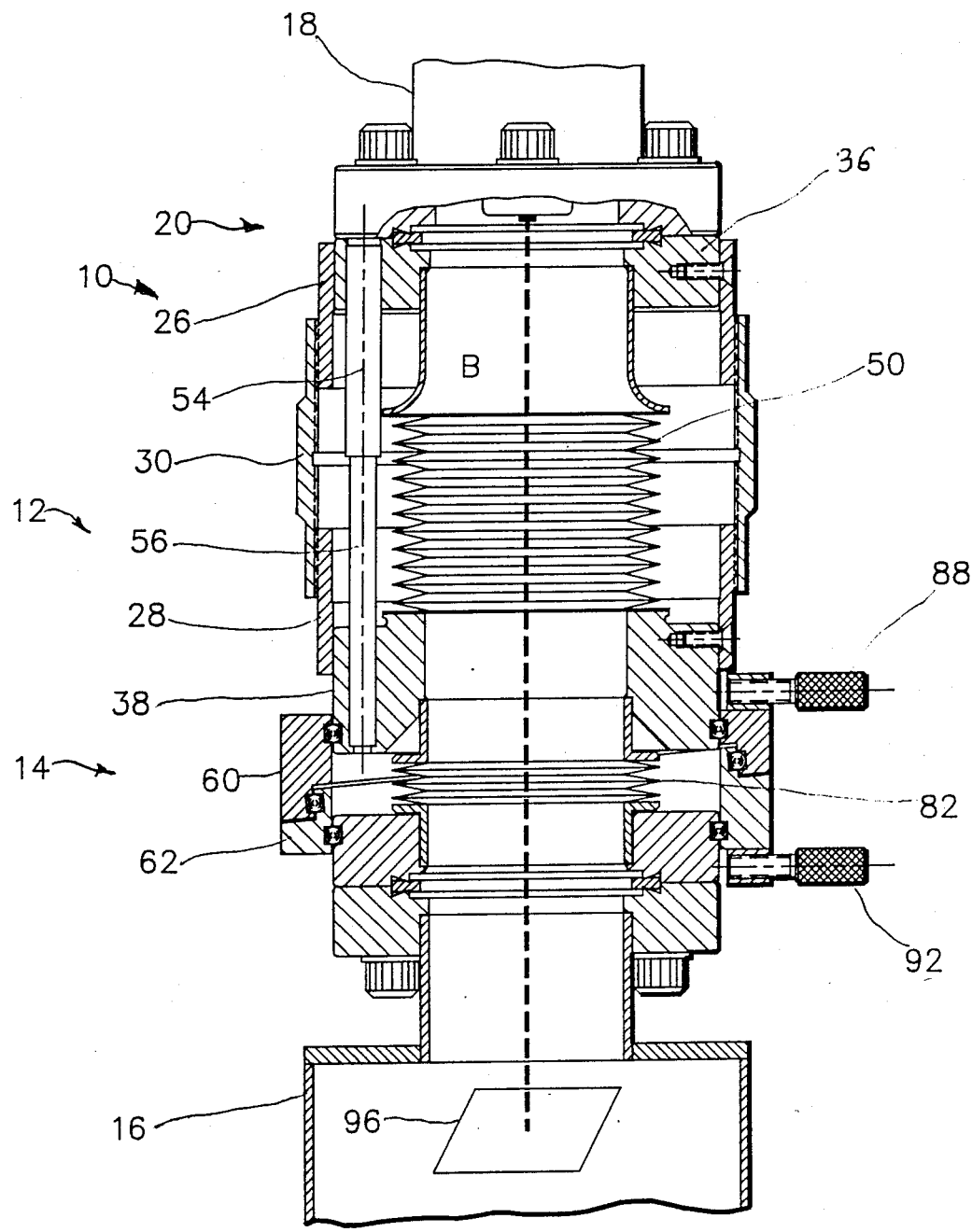
FIG. 2 is view similar to one in FIG. 1, but in a position at which the longitudinal axis of the first side member coincides with that of the second side member.
Figure 3:
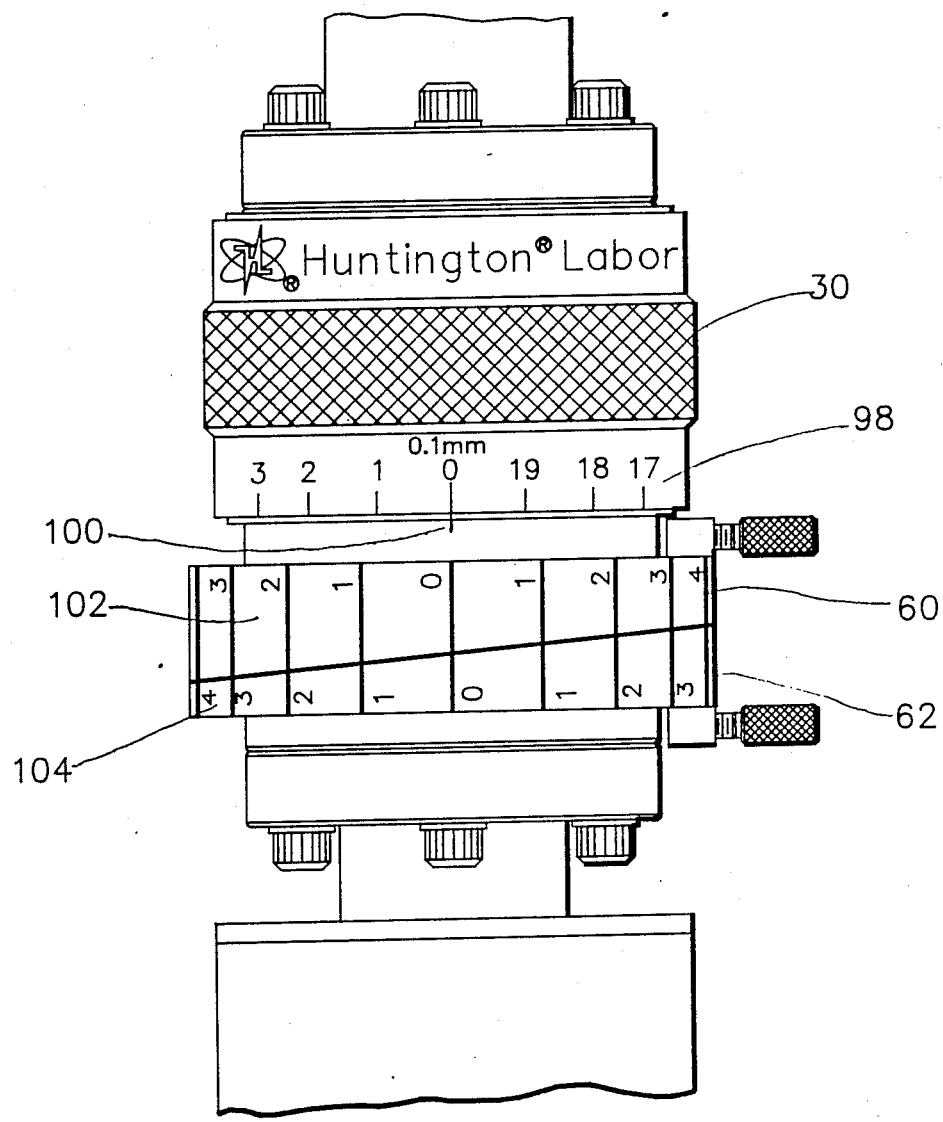
FIG. 3 is an external view of the device with scales on both rings and on one of the side members.

10 - high-energy beam generating unit
12 - beam-focusing unit
14 - adjustable connector unit
16 - vacuum chamber
18 - housing of the beam generator
20 - beam generator
22 - bolts
24 - seal ring
26 - tubular member with left-hand thread
26a - left-hand outer thread
28 - tubular member with right-hand thread
28a - right-hand outer thread
30 - sleeve
32 - left-hand inner thread
34 - right-hand inner thread
36 - upper block
38 - lower block
40, 42 - holes
44, 46 - screws
47 - sleeve
48 - weld seam
50 - bellows
52 - weld seam
54 - tubular element
56 - rod-like element
58 - flanged end member
60 - first ring element
62 - second ring element
64 - external annular groove
66 - internal annular groove
68, 70, 75 - balls
72, 74 - annular grooves
76 - bolts
78 - flanged portion
80 - seal ring
82 - second bellows
84, 86 - weld seams
88 - first thumbscrew
90 - tapped hole
92 - second thumb screw
94 - tapped hole 96 - silicon substrate
98 - focusing scale
100 - reference point
102, 104 - angular-position scale
106, 108 - ring elements
110, 112 - gear rings
114, 116 - brackets
118, 120 - pulse motors
122, 124 - pinions
130 - source of liquid nitrogen
132 - hollow rod
134 - interior of the rod
136 - sample
A - inclination angle
B - high-energy beam
R - radius of circle
P - beam spot on the substrate
X - longitudinal axis FIGS. 1–3—DESCRIPTION OF A DEVICE FOR FOCUSING AND POSITIONING A BEAM IN A VACUUM CHAMBER A beam-control device of the invention for focusing and angularly positioning a beam in a vacuum chamber is shown in FIGS. 1–3.

As shown in the drawings, the beam control device consists of four main units, i.e., a high-energy beam generating unit 10, a beam focusing unit 12, an adjustable connector unit 14, and a vacuum chamber 16. High-energy beam generating unit 10 has a housing 18 which contains a high-energy beam generator 20 which is fixed within housing 18 and which is capable of generating a high-energy beam, e.g., an electron beam, which is schematically shown by an axial line B. Beam generator 20 may be any conventional device of this type, the description of which is beyond the scope of the present invention.

High-energy beam generating unit 10 is connected to a beam focusing unit 12, e.g., by bolts 22. Since the interior of housing 18 is connected via focusing unit 12 to the interior of vacuum chamber 16, units 10 and 12 are interconnected via a seal ring 24, which may be a conventional bakable knife-edge type copper ring used in vacuum applications.

Focusing unit 12 consists of a tubular member 26 with a left-hand external thread 26a, a tubular member 28 with a right-hand external thread 28a, and a sleeve 30 which has on one side a left-hand inner thread 32, which is engaged with thread 26a, and a right-hand inner thread 34, which is engaged with thread 28a. As a result, sleeve 30 can be rotated in either direction to cause tubular members 26 and 28 to either approach each other or move apart.

At its upper and lower ends, focusing unit 12 has respective upper and lower blocks 36 and 38. These blocks have central holes 40 and 42, respectively, and are connected to corresponding tubular elements 26 and 28, respectively, by screws 44 and 46.

Inserted into hole 40 is a sleeve 47, which is connected to block 36 by a vacuum-proof weld seam 48. Sleeve 47 is connected to one end of a first bellows 50, the other end of which is connected to block 38, e.g., by a vacuum-proof weld seam 52. In conjunction with a second bellows, which will be described later, first bellows 50 allows for a relative axial movement of tubular elements 26 and 28 with respect to each other and at the same time seals the interior of housing 18, the space inside bellows 50 itself, and the interior of vacuum chamber 16 from the surrounding atmosphere.

In order to protect bellows 50 from twisting, focusing unit 12 has a a tubular element 54, which is arranged parallel to the longitudinal axis of the focusing unit and is pressed into block 36. Block 38 supports a rod-like element 56, which is pressed into block 38 and is telescopically inserted into tubular element 54. The provision of two telescopically connected elements 54 and 56 prevents the tubular members, and hence blocks 36 and 38, against angular displacement, since rotation of sleeve 30 will cause only axial displacement of the above-mentioned elements. Thus, bellows 50 will be protected from twisting.

Adjustable connector unit 14 consists of a flanged end member 58, and a pair of ring elements 60 and 62, which are located between lower block 38 and end member 58. The end of lower block 38, which protrudes from tubular member 28, has on its outer surface an external annular groove 64, while first ring 60 has an internal annular groove 66. Both grooves 64 and 66 form an annular race filled with a first set of balls 68.

Ring elements 60 and 62 are rotatably coupled to each other by a second set of balls 70 which are located in a second annular race which is formed by a pair of mating grooves 72 and 74. Groove 72 is formed on the inner surface of ring element 62 and groove 74 is formed on an outer surface of ring 62.

A third set of balls 75 is formed in a similar manner between ring element 62 and flanged end member 58.

The balls of each set are fed into a respective race through a hole in the respective ring, then the hole is plugged, e.g., by a force-fit or threaded plug (not shown) to keep the balls in place. The race with balls 74 between the two rings is inclined at an angle relative to the race with balls 68, so that the rotation of one ring relative to the other will cause a change in the angular orientation of lower block 38 and flanged end member 58 relative to each other without rotating these elements with respect to each other.

It is understood that although all the rotary connections have been shown as ball-bearing connections through ball races, they may be sliding rotary connections, provided the sliding guide between the rings is inclined at an angle relative to the guide between focusing unit 12 and connector unit 14.

Flanged end member is connected by bolts 76 to a flanged portion 78 of vacuum chamber 16. The connection is sealed by a seal ring 80, which may be of the same type as seal ring 24. The interior of vacuum chamber 16 is sealed against the surrounding atmosphere by a second bellows 82 which is connected by vacuum-proof weld seams 84 and 86 to lower block 38 and flanged end member 58, respectively.

First ring 60 carries a first thumb screw 88, which is threaded into a tapped hole 90 which passes through the side wall of ring 60. Similarly, second ring 62 carries a second thumbscrew 92 threaded into a tapped hole 94 which passes through the side wall of ring 62. Each thumbscrew is used as a handle for rotating a respective ring element and can be also used for fixation of the ring in an adjusted position. For this purpose, the thumb ring is screwed until its tip comes into contact with the outer surface of tubular element 28 (if it is a screw 88) or flanged end member 58 (if it is a screw 92).

Reference numeral 96 designates a silicon substrate, the surface of which is scanned by beam B. Although FIG. 1 is a vertical sectional view which is two-dimensional, for better understanding the principle of operation of the device, silicon substrate 96 is shown in a three-dimensional perspective presentation. Silicon substrate is supported by a holder, the construction of which is beyond the scope of the invention and which is not shown in the drawings.

Rotation of rings 60 and 62 with respect to each other changes an angle (hereinafter referred to as an angle of inclination) between their longitudinal axes. In fact, this angle, which in FIG. 1 is equal to A, is an angle between the longitudinal axis X of vacuum chamber 16, which is perpendicular to the plane of silicon substrate 96, and high-energy beam B emitted from beam generator 20 onto substrate 96. The rings can assume a position shown in FIG. 2 in which the inclination angle is equal to zero and both axes coincide. In a general case shown in FIG. 1, rotation of one of the rings will form a circular path P of beam B on the surface of substrate 96. The radius R of this circle will be determined by the angle of inclination. It is understood that by rotating both rings simultaneously in various or in similar directions at different speeds, it is possible to provide any intricate pattern of the beam's path on the surface of the substrate.

Rotation of sleeve 30 will move tubular elements 26 and 28 toward each other or in the opposite direction, thereby changing an axial distance betwen beam generator 20 and silicon substrate 96. This adjustment provides focusing of the beam's spot on the substrate being treated.

As shown in FIG. 3, which is a general non-sectional view of the device, sleeve 30 has a focusing scale 98 which moves with sleeve 30 when it is rotated with respect to a reference point 100 on lower block 38. Rings 60 and 62 have angular-position scales 102 and 104 which are used for installing the angle of inclination or for changing this angle in the course of processing of substrate 96 within vacuum chamber 16.

The angle of inclination may vary from 0° to 45°. In one practical embodiment of the device produced by Huntington Mechanical Laboratories Inc., Mountain View, Calif., the device of the invention had the following characteristics: linear travel, 25 mm; linear resolution, 0.1 mm; inclination angle, ±10°; angular resolution, 1°.

FIGS. 1–3—OPERATION OF THE DEVICE FOR FOCUSING AND POSITIONING OF BEAM IN A VACUUM CHAMBER

The device described above and shown in FIGS. 1–3 operates as follows:

Assume that the device, which consists of high-energy beam generating unit 10, focusing unit 12, and adjustable connector unit 14, is connected to vacuum chamber 16 by fixing flanged end member 58 to the housing of vacuum chamber 16 by bolts 76. Silicon substrate 96, which is to be treated in vacuum chamber 16, has been fixed in a holder (not shown) in a position to receive high-energy beam B emitted by beam generator 20.

The system is evacuated to a required level of vacuum, so that vacuum is induced within housing 18, bellows 50 and 82, and vacuum chamber 16. The generator 20 is energized and begins to emit beam B, which impinges onto substrate 96.

The beam spot on the substrate is focused by rotating sleeve 30 in the required direction. Specifically, when sleeve 30 is rotated, tubular members 26 and 28 with oppositely-cut threads are either moved toward each other or moved apart, so that the focusing distance between generator 20 and the plane of substrate 96 is changed. Tubular members 26 and 28 do not change their relative angular position, as they are axially guided by telescopically engaged elements 54 and 56, so that bellows 50 is not twisted.

The beam is then caused to describe a predetermined pattern on the surface of substrate 96 by manipulating rings 60 and 62, which are rotated in respective ball races formed by set of balls 68, 70, and 75. The position of the beam spot on the substrate is controlled with the help of scales 100, 102, and 104. If it is necessary to fix one of the rings and rotate the other, it can be done by thumbscrews 88 or 92.

After the treatment is over, generator 20 is deenergized and substrate 96 is either removed or transferred to a subsequent operation.

FIG. 4—DEVICE WITH AUTOMATIC DRIVE FROM PROGRAMMED PULSE MOTORS

Figure 4:
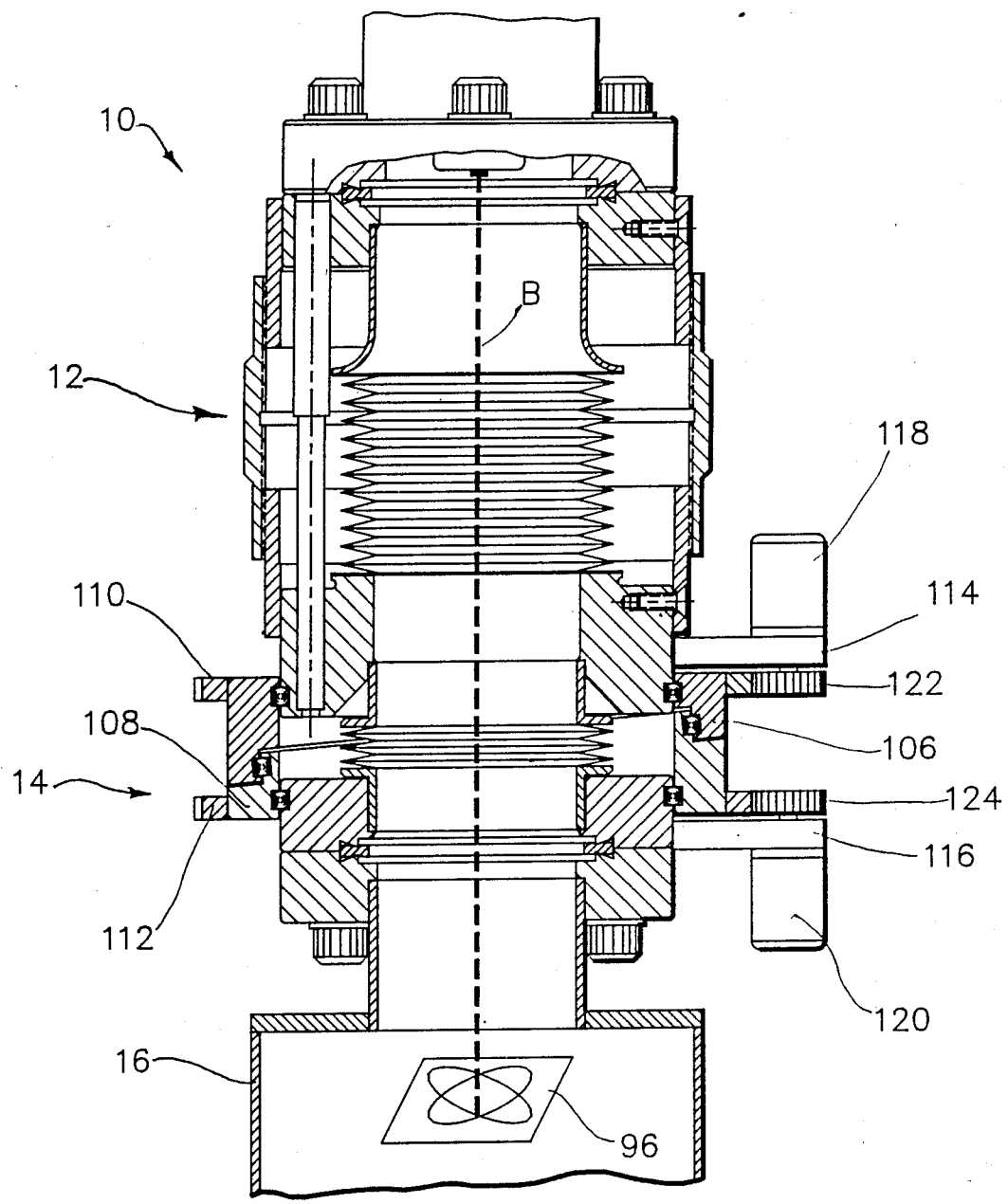
FIG. 4 is a vertical sectional view of a device with an automatic drive from programmed pulse motors.

FIG. 4 shows another embodiment of the invention, in which after focusing beam B manually, rings 60 and 62 and the pattern on substrate 96 is formed by an automatic drive from pulse motors in accordance with a predetermined program. In the description of this embodiment, parts identical with those shown in FIGS. 1–3 will be designated by the same reference numerals.

In general, the device of FIG. 4 has the same main units 10, 12, 14, and 16. A distinguishing feature of the embodiment of FIG. 4 is that ring elements 106 and 108 have gear rims 110 and 112, respectively. Ring element 106 has a bracket 114 rigidly attached thereto, while ring element 108 has a bracket 116. Brackets 114 and 116 support pulse motors 118 and 120, respectively. Brackets 114 and 116, together with pulse motors 118 and 120, are located so that their positions do not interfere with relative rotary motions of ring elements 106 and 108. An output shaft of pulse motor 118 carries a pinion 122 which is in mesh with gear rim 110, while an output shaft of pulse motor 120 carries a pinion 124 which is in mesh with gear rim 112. Pulse motors 118 and 120 may have a wireless control or may be supplied through current collectors (not shown in FIG. 4).

FIG. 4—OPERATION OF THE DEVICE OF FIG. 4

The device of FIG. 4 operates in the same manner as the previously-described device, except that ring elements 106 and 108 are driven from pulse motors which are controlled from a programmed device (not shown) for moving the beam spot S on silicon substrate 96 in accordance with a predetermined pattern.

When pulse motors 118 and 120 are energized and operate under the control of the programmed device, their pinions 122 and 124 drive respective gear rims 110 and 112 with predetermined speeds and in predetermined directions, so that inclination angle A is varied and spot S describes a required path on silicon substrate 96.

FIG. 5—DEVICE FOR ORIENTATION OF LONGITUDINAL ROD IN A SEALED CHAMBER

Figure 5:
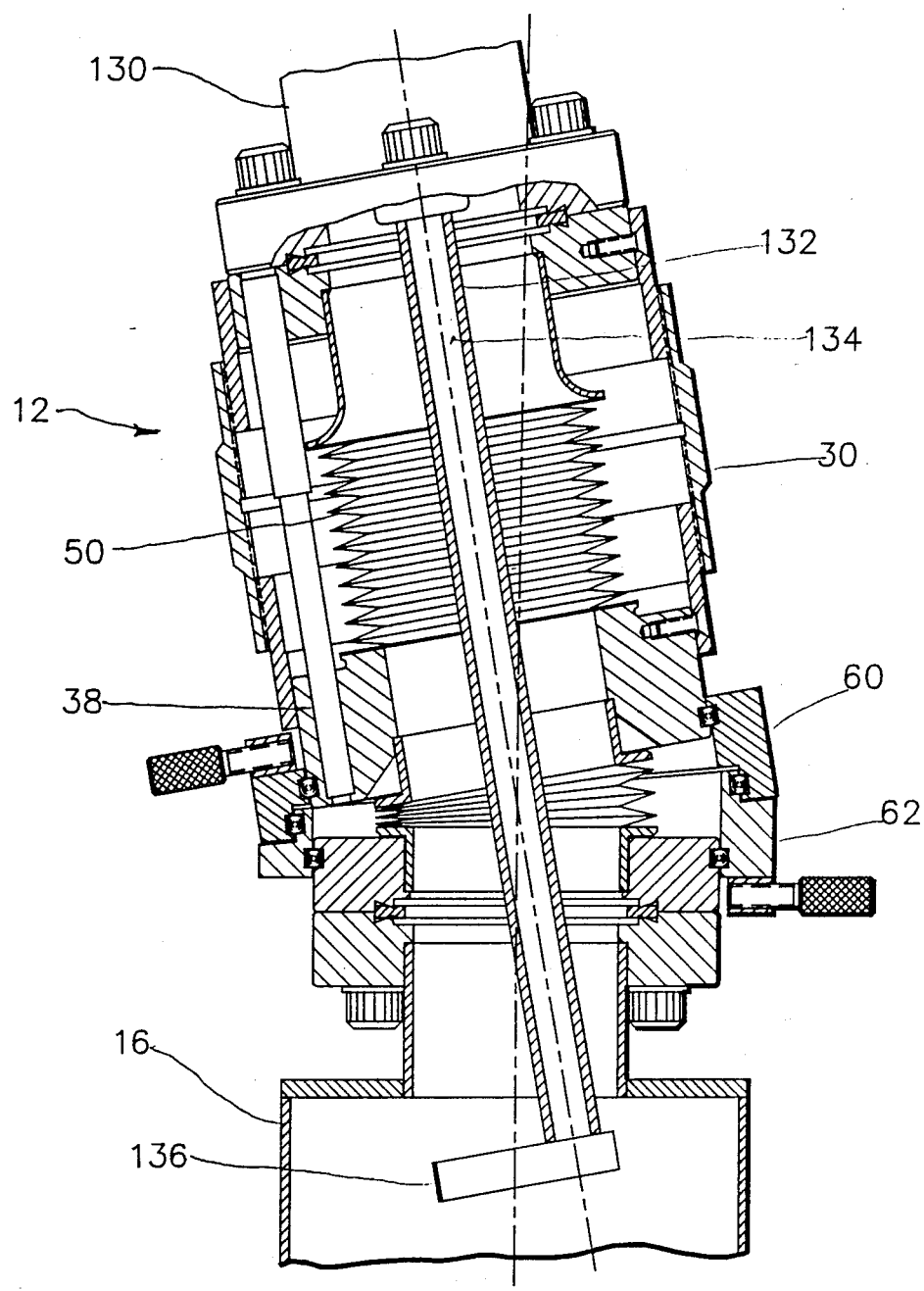
FIG. 5 is a vertical sectional view of a device for axial orientation and angular positioning of a rod with a sample holder in a sealed chamber.

FIG. 5 shows an embodiment which uses the principles of the invention to position a longitudinal object, such as rod, axially and angularly within a sealed chamber, e.g., a vacuum chamber. Since the embodiment of FIG. 5 is generally the same as embodiment of FIGS.

1-3, identical parts thereof will be designated by the same reference numerals and description of previously disclosed parts will be omitted.

The device of FIG. 5 differs from the embodiment of FIGS. 1-3 in that beam generator 20 is replaced by a source of supply of liquid nitrogen 130. Source 130 is connected to a hollow rod 132, which has a lumen 134 which is filled with liquid nitrogen used for cooling a sample 136. Sample 136 is attached to the end of hollow rod 132, which passes through bellows 50, lower block 38, and bellows 82 vacuum chamber 16. Rod 132 is oriented coaxially with the longitudinal axis of focusing device 12, which in the embodiment of FIG. 5 functions as a mechanism for microscopic axial adjustment of the position of sample 136.

Vacuum chamber 16 contains a source for treating sample 136, such as an ion-beam gun, an electron-beam gun, or a similar device (not shown). Sample 136 is to be oriented in vacuum chamber 16 with respect to such source.

FIG. 5—OPERATION

For axial orientation of sample 136 with respect to a processing unit (not shown) located in vacuum chamber 16, rod 134, which supports sample 136 and provides a supply of coolant to the treated sample, is moved axially by rotating sleeve 30 in the same manner as for focusing beam B in the device of FIG. 1. Angular orientation of sample 136 is performed by rotating ring elements relative to each other. Thus, in principle, the embodiment of FIG. 5 is structurally and functionally the same as the previously described embodiment, except that instead of an immaterial beam, the object which is to be oriented in the sealed chamber is a material object such as a hollow rod.

SUMMARY, RAMIFICATIONS, AND SCOPE

Thus it has been shown that the beam focusing and positioning device of the invention is simple in construction, easy to operate, has a reduced axial length, smaller weight, requires reduced number of connections and seals, inexpensive to manufacture, and is subject to a lesser risk of leakage.

Although the device has been described and illustrated with reference to specific practical embodiments, it is understood that these embodiments were given only as examples and that many modifications of the device are possible. For example, while the device has been shown as an electron-beam apparatus for forming a pattern on a silicon substrate by means of an electron beam, it can alternatingly be a plasma beam, an X-ray beam, or a light beam moveable with respect to any other object, such as a photosensitive plate, etc. Movement of the beam can be combined with movement of the object driven from a separate source, either manually or in accordance with a predetermined program. Focusing sleeve 30 can also be driven from a pulse motor through a gear, which may be formed on the surface of sleeve 30. Axial focusing adjustment can be conducted through a hydraulic mechanism instead of a sleeve and tubular elements having oppositely-directed threads. Ball bearings can be substituted by slide bearings and seals other than those shown in the drawings can be used. In the embodiment of FIG. 4, the ring elements can be driven from sources other than pulse motors. Axial rod 132 may carry a tool for mechanically treating an object in a sealed chamber. The sealed chamber may comprise a space for treating a hazardous object such as a radioactive substance, etc. The axial rod can be used as a mechanical arm with a mechanism for gripping and realising the object. Therefore the scope of the invention should be determined, not by the examples given, but by the appended claims and their legal equivalents.

I claim:

1. A device for axially and angularly positioning an object in a sealed chamber, comprising:
   a sealed housing having an opening and a longitudinal axis;
   an object to be positioned, said object being connected to said housing so that said axis passes through said object;
   a sealed chamber for holding and treating said object in said chamber, said sealed chamber being connected to said sealed housing at said opening;
   means for axially displacing said object, said axially-displacing means being sealingly connected at one end to said housing through a seal ring and having a first sealing device which surrounds said longitudinal axis;
   an adjustable connector unit at the other end of said axial-displacement means, said adjustable connector comprising a first ring element which is rotatably installed on said other end of said axial-displacement means in a first rotary guide, and a second ring element, which rotatably supports said first ring element in a second rotary guide and is rotatably installed on said sealed chamber in a third rotary guide, said adjustable connector having means for changing the angular position of said angular-displacement means and hence of said axis with respect to said sealed chamber; and
   a second sealing device which surrounds said axis and is located inside said adjustable connector unit, so that said axis passes from said housing to said sealed chamber through a sealed space.

2. The device of claim 1 wherein said object to be positioned comprises a beam generator for emitting a linear beam, the direction of said beam being coincident with said longitudinal axis, and wherein said sealed chamber comprises a vacuum chamber which contains an object to be treated with said beam.

3. The device of claim 2 wherein said means for changing said angular position comprises said second rotary guide, said second rotary guide being inclined at an angle with respect to said first rotary guide.

4. The device of claim 3 wherein said first rotary guide, said second rotary guide, and said third rotary guide comprise mating annular grooves on said rotatably-connected parts, and further including a set of balls which fills said grooves.

5. The device of claim 2 wherein said beam generator is a high-energy beam generator and said beam is a high-energy beam.

6. The device of claim 2 wherein said high-energy beam generator is an electron-beam generator and said beam is an electron beam.

7. The device of claim 2 wherein said axial-displacement means comprises means for focusing said beam, said beam-focusing means comprising a cylindrical hollow body with a first end element, said first end element being rigidly connected to said generator housing, and a second end element which is rotatably connected to said first ring element, each of said end elements having an opening for passing said beam to said object to be treated, said cylindrical body consisting of a first tubular member, a second tubular member, and a sleeve which interconnects both of said tubular members, said sleeve and tubular members having means for relative axial movement of said tubular elements.

8. The device of claim 7 wherein said first sealing device is a bellows, one end of which is sealingly connected to said first end element and the second end is sealingly connected to said second end element, and wherein said second sealing device is a bellows, one end of which is sealingly connected to said second end element and the other end of which is sealingly connected to said vacuum chamber.

9. The device of claim 7 wherein said means for relative movement of said tubular elements comprises a first outer thread on one of said tubular elements, a second outer thread opposite in its direction to said first thread and formed on said second tubular element, and respective inner threads on the opposite ends of said sleeve which are in engagement with said first and second inner threads, so that when said sleeve is rotated, said tubular elements are either moved apart or toward each other.

10. The device of claim 1 wherein said object to be positioned comprises a longitudinal element, the longitudial axis of which coincides with said longitudinal axis of said object to be positioned, said longitudinal element passing through said opening to said sealed chamber.

11. The device of claim 10 wherein at its end which passes into said sealed chamber, said longitudinal element has a sample holder for holding said object to be treated in said sealed chamber.

12. The device of claim 11 wherein said housing contains a source of coolant and said longitudinal element is hollow and is connected with said source of coolant so that said coolant fills said longitudinal element and can cool said sample.

13. A device for focusing and positioning a beam in a vacuum chamber, comprising:
a sealed housing with an opening;
a beam generator for generating a beam which passes through said opening;
a vacuum chamber for treating an object in a vacuum by said beam, said vacuum chamber containing said object supported in said chamber in a position in which said beam impinges on said object;
focusing means for focusing the point of intersection of said beam with said object, said focusing means being sealingly connected at one end to said housing of said generator means through a seal ring and has a first sealing device which surrounds said beam;
an adjustable connector unit at the other end of said focusing means, said adjustable connector comprising a first ring element which is rotatably installed on said other end of said focusing means in a first rotary guide, and a second ring element, which rotatably supports said first ring element in a second rotary guide and is rotatably installed on said vacuum chamber in a third rotary guide, said adjustable connector having means for changing angular position of said focusing means and hence of said beam with respect to said object; and
a second sealing device which surrounds said beam and is located inside said adjustable connector unit and surrounds said beam, so that said beam passes from said beam generator in said sealed housing to said object in said vacuum chamber through a sealed space.

14. The device of claim 13 wherein said means for changing angular position comprises said second rotary guide which is inclined at an angle with respect to said first rotary guide.

15. The device of claim 14 wherein said first rotary guide, said second rotary guide, and said third rotary guide comprise mating annular grooves on said rotatably-connected parts, and further includes a set of balls which fills said grooves.

16. The device of claim 13 wherein said beam generator is a high-energy beam generator and said beam is a high-energy beam.

17. The device of claim 13 wherein said high-energy beam generator is an electron-beam generator and said beam is an electron beam.

18. The device of claim 13 wherein said focusing means comprises a cylindrical hollow body with a first end element, which is rigidly connected to said generator housing, and a second end element which is rotatably connected to said first ring element, each of said end elements having an opening for passing said beam to said object, said cylindrical body comprising a first tubular member, a second tubular member, and a sleeve which interconnects said both tubular members, said sleeve and tubular members having means for relative axial movement of said tubular elements.

19. The device of claim 18 wherein said first sealing device is a bellows, one end of which is sealingly connected to said first end element and the second end is sealingly connected to said second end element, and wherein said second sealing device is a bellows, one end of which is sealingly connected to said second end element and the other end is sealingly connected to said vacuum chamber.

20. The device of claim 18 wherein said means for relative movement of said tubular elements comprise a first outer thread on one of said tubular elements, a second outer thread opposite in its direction to said first thread and formed on said second tubular element, and respective inner threads on the opposite ends of said sleeve which are in engagement with said first and second inner threads, so that when said sleeve is rotated, said tubular elements are either moved apart or toward each other.

21. A device for focusing and positioning a beam in a vacuum chamber, comprising:
a sealed housing with an opening;
a high-energy beam generator for generating a high-energy beam which passes through said opening;
a vacuum chamber for treating an object in a vacuum by said high-energy beam, said vacuum chamber containing said object supported in said chamber in a position in which said high-energy beam intersects with said object;
a focusing unit for focusing the point of intersection of said high-energy beam with said object, said focusing unit being sealingly connected at one end to said housing of said generator unit through a seal ring and having a first sealing device which surrounds said beam;
an adjustable connector unit at the other end of said focusing unit, said adjustable connector comprising a first ring element which is rotatably installed on said other end of said focusing device in a first rotary guide, and a second ring element, which rotatably supports said first ring element in a second rotary guide and is rotatably installed on said vacuum chamber in a third rotary guide, said adjustable connector having means for changing angular position of said focusing unit and hence of said high-energy beam with respect to said object;

a second sealing device which surrounds said beam and is located inside said adjustable connector unit and surrounds said beam, so that said beam passes from said beam generator in said sealed housing to said object in said vacuum chamber through a sealed space, said means for changing angular position comprises said second rotary guide which is inclined at an angle with respect to said first rotary guide;

indicating means for indicating relative positions of said ring elements, and hence an angle of inclination of said beam to said object; and means for rotating said ring elements and for fixing them in any position within a predetermined range of positions.

22. The device of claim 21 wherein said first rotary guide, said second rotary guide, and said third rotary guide comprise mating annular grooves on said rotatably-connected parts and a set of balls which fills said grooves.

23. The device of claim 21 wherein said high-energy beam generator is an electron-beam generator and said high-energy beam is an electron beam.

24. The device of claim 21 wherein said focusing unit comprises a cylindrical hollow body with a first end element, which is rigidly connected to said generator housing, and a second end element which is rotatably connected to said first ring element, each said end having an opening for passing said beam to said object, said cylindrical body consisting of a first tubular member having a first external thread, a second tubular member having a second external thread which is opposite in its direction to said first external thread, and a sleeve with a first inner thread on one end which mates with said first external thread, and a second inner thread on he other end which mates with said second external thread, so that when said sleeve is rotated, said tubular elements are moved apart or toward each other.

25. The device of claim 24 wherein said first sealing device is a bellows, one end of which is sealingly connected to said first end element and the second end is sealingly connected to said second end element, and wherein said second sealing device is a bellows one end of which is sealingly connected to said second end element and the other end is sealingly connected to said vacuum chamber, said second end element having a scale on its outer surface for indicating the focusing position.

26. The device of claim 21 wherein said means for rotating said ring elements and fixing them in position comprises a threaded hole formed in each of said ring elements, and a thumb screw screwed into each said threaded hole, so that a head of each screw is used as a handle for rotating said respective ring element, while the end of each screw on the side opposite to said head can come into contact with the part on which said ring element is rotatably installed and lock said ring element.

27. The device of claim 21 wherein said indicating means comprise a scale with divisions on said first ring element, and a scale with divisions on said second ring element.

28. A device for focusing and positioning a beam in a vacuum chamber, comprising:

a sealed housing with an opening;

a beam generator for generating a beam which passes through said opening;

a vacuum chamber for treating an object in a vacuum by said beam, said vacuum chamber containing said object supported in said chamber in a position in which said beam intersects with said object;

focusing means for focusing the point of intersection of said beam with said object, said focusing means being sealingly connected at one end to said housing of said generator means through a seal ring and has first sealing device which surrounds said beam;

an adjustable connector unit at the other end of said focusing means, said adjustable connector comprising a first ring element which is rotatably installed on said other end of said focusing means in a first rotary guide, and a second ring element which rotatably supports said first ring element in a second rotary guide and is rotatably installed on said vacuum chamber in a third rotary guide, said adjustable connector having means for changing the angular position of said focusing means and hence of said beam with respect to said object;

a second sealing device which surrounds said beam and is located inside said adjustable connector unit and surrounds said beam, so that said beam passes from said beam generator in said sealed housing to said object in said vacuum chamber through a sealed space; and means for driving said ring elements into rotation under a command of a programmed device.

29. The device of claim 28 wherein said means for changing angular position comprises said second rotary guide which is inclined at an angle with respect to said first rotary guide.

30. The device of claim 28 wherein said first rotary guide, said second rotary guide, and said third rotary guide comprise mating annular grooves on said rotatably-connected parts, and further including a set of balls which fills said grooves.

31. The device of claim 28 wherein said beam generator is a high-energy beam generator and said beam is a high-energy beam, said focusing means comprising a cylindrical hollow body with a first end element, which is rigidly connected to said generator housing, and a second end element which is rotatably connected to said first ring element, each said end having an opening for passing said beam to said object, said cylindrical body consisting of a first tubular member, a second tubular member, and a sleeve which interconnects said both tubular members, said sleeve and tubular members having means for :elative axial movement of said tubular elements, said first sealing device being a bellows, one end of which is sealingly connected to said first end element and the second end is sealingly connected to said second end element, and wherein said second sealing device is a bellows, one end of which is sealingly connected to said second end element and the other end is sealingly connected to said vacuum chamber, said means for relative movement of said tubular elements comprising a first outer thread on one of said tubular elements, a second outer thread opposite in its direction to said first thread and formed on said second tubular element, and respective inner threads on the opposite ends of said sleeve which are in engagement with said first and second inner threads, so that when said sleeve is rotated, said tubular elements are either moved apart or toward each other.

32. The device of claim 31 wherein said means for driving said ring elements comprises a pulse motor rigidly installed on each of said ring elements and having a pinion on its output shaft, each of said ring elements having a gear wheel which is in mesh with one of said pinions, so that when said pulse motors are activated, rotation of said pinions cause rotation of said gear wheels and hence of said ring elements in a given direction and at a given speed.

* * * * *